United States Patent
Chen et al.

(10) Patent No.: US 10,302,714 B2
(45) Date of Patent: May 28, 2019

(54) MAGNETIC RESONANCE RADIO FREQUENCY PULSE DESIGN USING MACHINE LEARNING

(71) Applicant: Siemens Healthcare GmbH, Erlangen (DE)

(72) Inventors: Xiao Chen, Somerset, NJ (US); Mariappan S. Nadar, Princeton, NJ (US); Benjamin L. Odry, West New York, NJ (US); Boris Mailhe, Plainsboro, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 106 days.

(21) Appl. No.: 15/705,889

(22) Filed: Sep. 15, 2017

(65) Prior Publication Data
US 2019/0086488 A1 Mar. 21, 2019

(51) Int. Cl.
*G01R 33/34* (2006.01)
*G01R 33/54* (2006.01)

(52) U.S. Cl.
CPC .......... *G01R 33/34* (2013.01); *G01R 33/543* (2013.01)

(58) Field of Classification Search
CPC .............................. G01R 33/34; G01R 33/543
See application file for complete search history.

(56) References Cited

U.S. PATENT DOCUMENTS

| | | | |
|---|---|---|---|
| 7,336,145 B1 | 2/2008 | Zelinski et al. | |
| 7,466,131 B1 | 12/2008 | Xu et al. | |
| 7,705,594 B2 | 4/2010 | Xu et al. | |
| 2015/0289779 A1* | 10/2015 | Fischl | A61B 5/0037 600/410 |
| 2015/0302297 A1 | 10/2015 | Griswold et al. | |
| 2017/0007148 A1* | 1/2017 | Kaditz | A61B 5/055 |
| 2019/0025392 A1* | 1/2019 | Chen | G01R 33/543 |

OTHER PUBLICATIONS

Pauly, John: "The Art of RF Pulse Design for MRS" Magnetic Resonance Systems Research Laboratory, pp. 1-8, 2006.

\* cited by examiner

*Primary Examiner* — Rodney A Bonnette

(57) ABSTRACT

Systems and methods are provided for automatically designing RF pulses using a reinforcement machine-learnt classifier. Data representing an object and a selected outcome is accessed. A reinforcement learnt method identifies the RF pulse sequence that generates a result within a predefined value of the selected outcome. An MRI scanner images the object using the RF pulse sequence.

20 Claims, 4 Drawing Sheets

MAGNETIC RESONANCE RADIO FREQUENCY PULSE DESIGN USING MACHINE LEARNING

FIELD

The present embodiments relate to medical imaging.

BACKGROUND

In magnetic resonance imaging (MRI), imaging objects are stimulated using radio frequency (RF) pulses to generate signals. To obtain a magnetic resonance (MR) image of an object, the object is placed in a uniform magnetic field. As a result, the object's hydrogen nuclei align with the magnetic field and create a net magnetic moment. A RF pulse is applied. The pulse causes the magnetization to change. Once the RF signal is removed, the nuclei realign themselves such that the net magnetic moment returns. The return to equilibrium is referred to as relaxation. During relaxation, the nuclei lose energy by emitting a RF signal. The signal is measured by a conductive field coil placed around or on the object being imaged. The measurement is processed or reconstructed to obtain MR images.

RF pulses may be designed to generate different reactions under different scenarios or different tissues. The challenge of pulse design is to determine a RF pulse that excites a desired magnetization profile (signal). The change in magnetization and gradient fields may be solved by Bloch equations, for which no analytic inversion exists with respect to the change in magnetization. As such, the "forward problem" of calculating the signal generated by a given RF pulse may be solved by a Bloch simulation, while the "backward problem" of designing the RF pulse that may generate a desired signal is difficult, given the non-linearity of the system.

Designing an RF pulse is even more challenging when requirements such as narrow transition band (spatially, spectrally, and etc.), short RF duration, restricted energy deposition, and insensitivity to system imperfection are attached.

SUMMARY

By way of introduction, the preferred embodiments described below include methods and systems for designing RF pulse sequences for MRI using a reinforcement learning strategy. For the reinforcement learning strategy, the states are the effect of the RF pulses. The RF pulses and gradients are actions that change the states. The actions that generate closer representation of the targeted state are rewarded. A series of actions (RF Pulses and/or gradients) are learned by the system to produce a desired result.

In a first aspect, a method is provided for designing a RF pulse sequence. A processor identifies a selected magnetization for an object. The processor computes an effect of a first RF pulse to the object, wherein the effect comprises a computed magnetization, determines a difference between the selected magnetization and computed magnetization, and selects, by a reinforcement machine-learnt classifier, a second RF pulse. The processor repeats with the second RF pulse replacing the first RF pulse, the computing, determining, and selecting until the difference between the selected magnetization and computed magnetization is less than a predefined threshold. The processor stores the sequence of RF pulses including at least the first RF pulse and second RF pulse for use in a subsequent MRI scan by an MRI scanner.

In a second aspect, a method is provided for automatically generating a RF pulse sequence. A processor accesses data representing an object and a selected outcome. The processor performs a reinforcement learnt method to identify the RF pulse sequence that generates a result within a predefined value of the selected outcome. An MRI scanner images the object using the RF pulse sequence.

In a third aspect, a system is provided for generating an efficient MRI scan. The system includes a memory, a Bloch simulator, and a processor. The memory is configured to store a representation of an object. The Bloch simulator is configured to simulate the effect of a RF pulse on the representation of the object. The processor is configured to identify a sequence of RF pulses using a reinforcement machine-learnt classifier and the simulations of the Bloch simulator.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION

Figure 1:
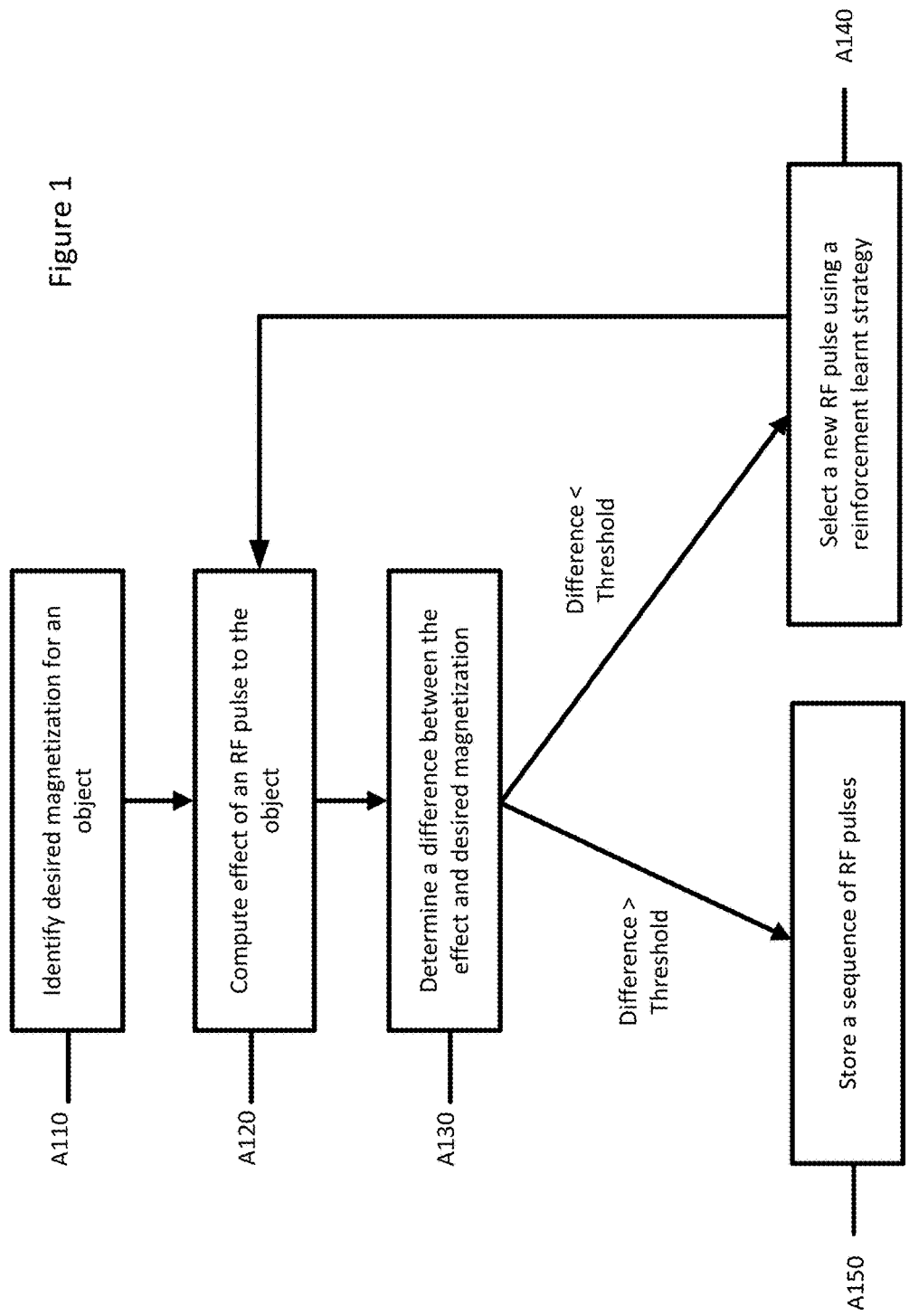
FIG. 1 depicts an example workflow for designing RF pulses using a reinforcement machine-learnt classifier.

A system and method for designing RF pulses using machine learning is provided. Using a stored model of an object, an effect of an RF pulse is simulated. The effect is compared to a desired result. If the effect is not within a predetermined threshold, a second RF pulse is selected using a reinforcement taught network. The effect of the second RF pulse is simulated and compared to the desired result. The process repeats until the effect is within the predetermined threshold of the desired result. The final sequence of RF pulses is stored to be used in a MRI scan of the object.

MRI works by imaging signals from hydrogen in the body. The body is placed in a strong magnetic field, referred to as the $B_0$ field, and then a radio frequency (RF) signal, referred to as the $B_1$ field, is transmitted to selectively excite the parts of the object to be imaged. Along with linear gradient fields, signals from the excited parts are encoded to produce MR images that reflect the anatomy.

In MRI scanners, angular momentum possessed by the hydrogen nucleus, aka spins, generate a net effect called magnetization that varies spatially (r) and temporally (t) and is referred to as M(r,t). M(r,t) is aligned with the main field direction (e.g. the z direction or the longitudinal direction) in the equilibrium, but detectable MRI signals are only from the transverse components of the magnetization that is perpendicular to z. To generate MRI signal, the magnetization is tipped towards the transverse plane (x-y plane) by a $B_1$ field that is within the transverse plane. The process of altering the magnetization is referred to as excitation. Excitation uses a RF pulse, along with linear gradient fields, to provide a spatially varying transverse magnetization pattern. The linear gradient fields (gradients) include three channels that are along x, y and z directions respectively, and linearly vary the main field to generate spatial variations of magnetization behaviors. The relation between the magnetization behaviors and the applied fields is governed by the Bloch equations. The Bloch equations are a set of equations that are used to calculate the nuclear magnetization M=(Mx, My, Mz) as a function of time when relaxation times T1 and T2 are present.

Both RF fields and gradients may be temporally varied and programmed by RF pulse designers to provide a desired target pattern of the magnetization due to the RF pulse and gradients. RF pulse design is, as such, a process that takes the target pattern of the magnetization, M, as input and determines the unknown gradients, Gx(t), Gy(t), Gz(t), and RF pulse, B1(t), based on a certain input-output relationship, such as in the Bloch equation, and the initial state of the magnetization, M(r,0). Two or more RF pulses may be combined to form a RF pulse sequence.

The challenge for RF pulse sequence design is to obtain accurate RF pulses and gradients by solving for an arbitrary target pattern from an arbitrary initial state. The solution may be too computationally intensive or there may be no analytical solution. In certain prior solutions, the RF design solutions may be approximated. For example, one RF pulse design approach is known as the small tip angle (STA) approximation. The STA approximation is used for RF pulse profiles having tip angles of less than 90 degrees. Fourier transform approximation may be used for approximation of the STA. Another approach is known as the linear class large tip angle approximation (LCLTA). At large flip angle, methods such as Shinnar-Le Roux (SLR) algorithm may generate a RF pulse for a specific task but only at a single flip angle. The SLR algorithm requires extensive parameter tuning and may not be suitable for adiabatic pulse design. Additionally, the STA and LCLTA approaches are limited in that the methods are linear approximations of the Bloch equations, and thus have inherent errors in the results. The errors may be translated into ripples and rounded edges in the magnetization profiles when the assumptions of STA/LCLTA are approximately met, or into large distortions from the ideal magnetization profiles when the assumptions are violated.

For medical imaging diagnosis, having accurate and well-defined visualization of an object is of key importance. Prior methods such as STA and LCLTA provide rough estimation for RF pulses, the result of which may be visualizations that have errors or distortions. Embodiments described herein provide systems and methods for using machine learning techniques to efficiently design RF pulses that may be used to generate accurate images from MRI scans.

FIG. 1 illustrates one embodiment of a method for designing a RF pulse sequence. The method identifies a sequence of RF pulses for an object. The RF pulses are selected from possible RF pulses using machine learning. As referred to herein, gradients may be included in the RF pulse design. For example, values for gradients may be included with the RF pulses. The sequence of RF Pulses may be defined by a description of the RF values, gradients, and data acquisition over time. The output of the method may be a sequence of RF pulses that provide an end state that aligns closely to a desired state of magnetization for the object. The sequence data, including parameters for the RF pulse and/or gradients may be stored for use in an MRI scan of an object.

Figure 4:
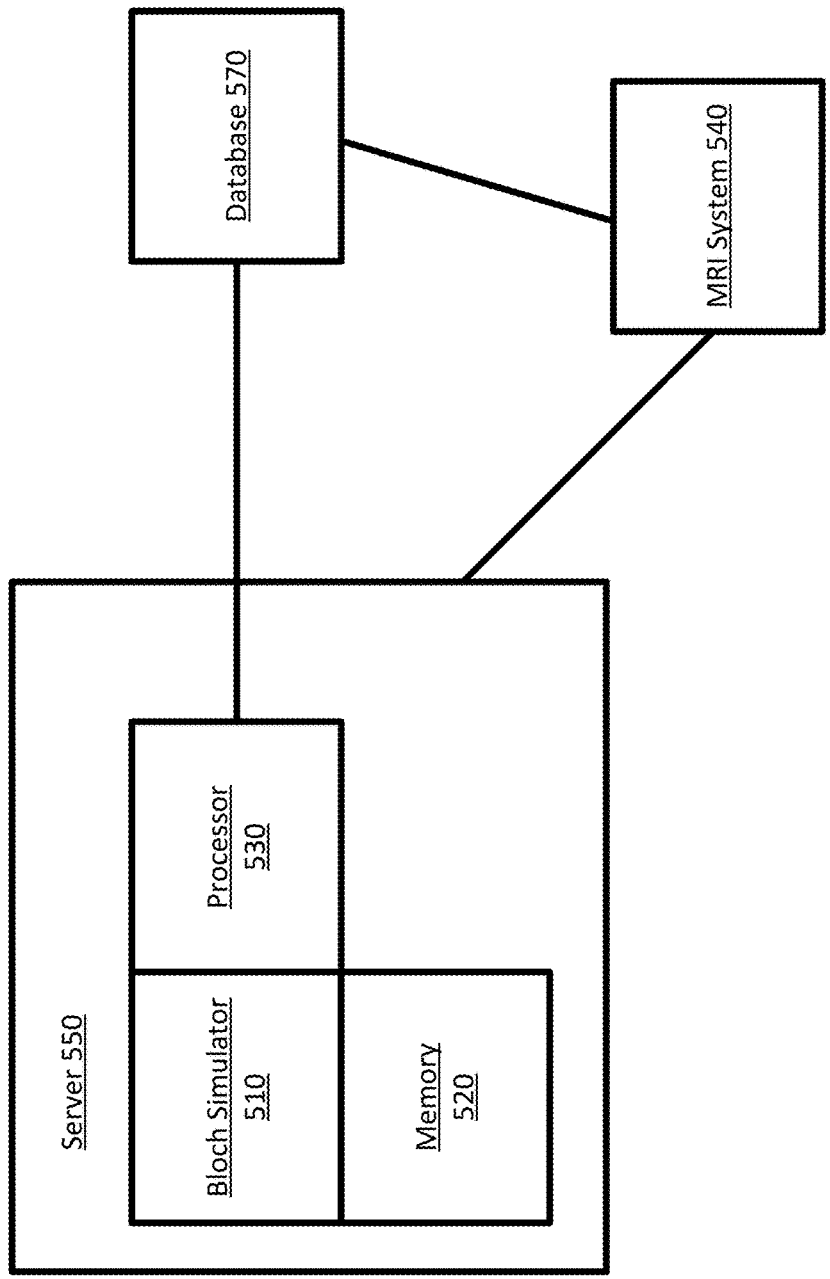
FIG. 4 is a block diagram of one embodiment of a system for designing RF pulses.

The acts are performed by the system of FIG. 4, other systems, a medical scanner, a workstation, a computer, and/or a server. For example, A110 may be performed by a workstation. Act A120 may be performed by a server or Bloch simulator. Act A130 is performed by a server, a workstation, or a computer. Additional, different, or fewer acts may be provided. For example, the acts A120, A130, and A140 may be repeated. The acts are performed in the order shown (e.g., top to bottom) or other orders.

At act A110, a desired magnetization for an object is identified. The object may be, for example, a portion of a body. The object may be represented by a model of the portion of a body. The object, for example, may be a three-dimensional model of an anatomical structure of a patient. Alternatively, the model may be a two-dimensional model. For a three-dimensional model of an object, the model may include three-dimensional anatomical images of distinct tissue types of the object with specified MR parameters (e.g. relaxation times T1, T2, spin density, susceptibility value, and chemical shift value among other parameters) for each of the tissue types. For example, if the object is a brain, then a model may include a collection of tissue templates: three-dimensional anatomical images of distinct tissue types (e.g. one template of grey matter, another of white matter, and a third of cerebro-spinal fluid). If the object is a breast, then a collection of the tissue templates may include three-dimensional anatomical images of fat tissue, skin, etc.

The selected magnetization may be selected by an operator. The selected magnetization may relate to an optimization of a MRI scan or MRI scan image. The selected magnetization may provide, for example, a clearer image or an image with preferred contrast between tissues.

In an embodiment, the model, parameters, and image quality may be based on prior MRI scan data. For example, the system may collect and store data from scans. The MR parameters, for example, may be identified from previous tissues sample or prior measurements. The image quality (e.g. contrast levels) may be identified from user feedback.

At act A120, an effect of a first RF pulse on the object is computed. The effect may include a change in the magnetization to a new state. The first RF pulse may be selected by an operator. Alternatively, the first RF pulse may be identified by the reinforcement learnt strategy described at act A140. If the process is repeated the first RF pulse may be subsequent to another previous RF pulse in the pulse sequence. A default or other pulse based on a given application may be used as the initial RF pulse. The initial or first RF pulse may be selected based on best practices (e.g. operator experience). The first RF pulse may be provided at random by the system.

Bloch equations may be used to compute the effect of the first RF pulse on the initial or current magnetization state (e.g. the local spin magnetization vector). In an embodiment, a Bloch simulator may be used. An example Bloch simulator may use values for $B_0$, the amplitude and frequency of the RF pulse, T1 and T2 to generate a model of the resulting magnetization. The Bloch equations are a set of equations that are used to calculate the magnetization M=(Mx, My, Mz) as a function of time when relaxation times T1 and T2 are present.

In an embodiment, the first RF pulse may be represented as a three-dimensional vector with changing orientation and magnitude in time, B(t). The effect of the RF pulse may be magnetization spins that include an effective off-resonance dw. The effect may be also be described as a three-dimensional vector changing in time, M(t,dw). The effective off-resonance dw follows a distribution pattern and may arise from any elements that may cause an off-resonance rotation, such as spatial gradients and chemical shift. Converting the continuous variable to a discrete variable using the minimum unit time on the scanner, the effect of an RF pulse on a magnetization spin experiencing certain off-resonance may be calculated as $M_T(dw)$, the final magnetization at off-resonance dw. The distribution of $M_T$ over dw is the excitation profile.

At act A130, a difference between the desired magnetization and computed magnetization is calculated. The difference may be calculated as a difference between $M_T(dw)$ and the computed magnetization (e.g. effect of act A120).

In an embodiment, the desired magnetization and computed magnetization are described by the distribution of the magnetization over the off-resonance. The difference may be computed using L1-norm or L2-norm. An L1-norm is also referred as least absolute deviations (LAD), least absolute errors (LAE). The L1-norm minimizes the sum of the absolute differences between the target value and the estimated value in the distributions. The L2-norm minimizes the sum of the square of the differences between the target value and the estimated values in the distribution. Alternative metrics may be used to calculate difference between the two distributions.

At act A140, a second RF pulse is selected using a machine learnt strategy, for example, a reinforcement machine-learnt classifier. A reinforcement machine-learnt classifier may select the second RF pulse based on a reward policy. A reinforcement machine-learnt classifier identifies how an agent should take action (e.g., what actions to take) in an environment so as to maximize a reward.

One example of a reinforcement learning method is a Markov Decision Process (MDP). In an MDP, outcomes are partly random (determined by the environment) and partly under the control of an agent responding to the environment. In an MDP, the actions available to the agent when in a given state are dependent on that state. At each point in time, the agent performs an action and the environment generates an observation of the state resulting in a reward. The sequence of actions is optimized to maximize the total reward from the sequence over time or the final reward. Reinforcement learning may include learning a function that estimates the total future rewards that may be achieved from any given state, so that the agent may decide the next action based not only on its immediate reward, but also on the long-term future. A reinforcement learning strategy may guide the actions of the agent so that the state of the environment (controlled by the agent) reaches a selected end point within a specified time period.

For applying reinforcement learning to the RF pulse generation, the agent is the RF pulse generator, the state is the Magnetization Mi (spin-state), the action is an RF pulse, the observation is the signal, and the reward at each time step is the difference. The agent may include a simulator used to calculate each state using the Bloch equations. In operation, the agent selects a RF pulse that changes the state of the environment (magnetization). The reward for the agent is based on prior learning by the reinforcement learnt strategy whether or not the changed state of the environment leads to a selected end state environment (and the magnitude of the movement towards the desired end state). An action that generates a state that leads away from the selected result is not rewarded or is negatively rewarded. An action that generates a state that leads to the selected result is rewarded. Over time, the reinforcement learning strategy learns the states (and actions) that are rewarded the most. The learnt states (and actions) provide an efficient path to the selected result.

Figure 2:
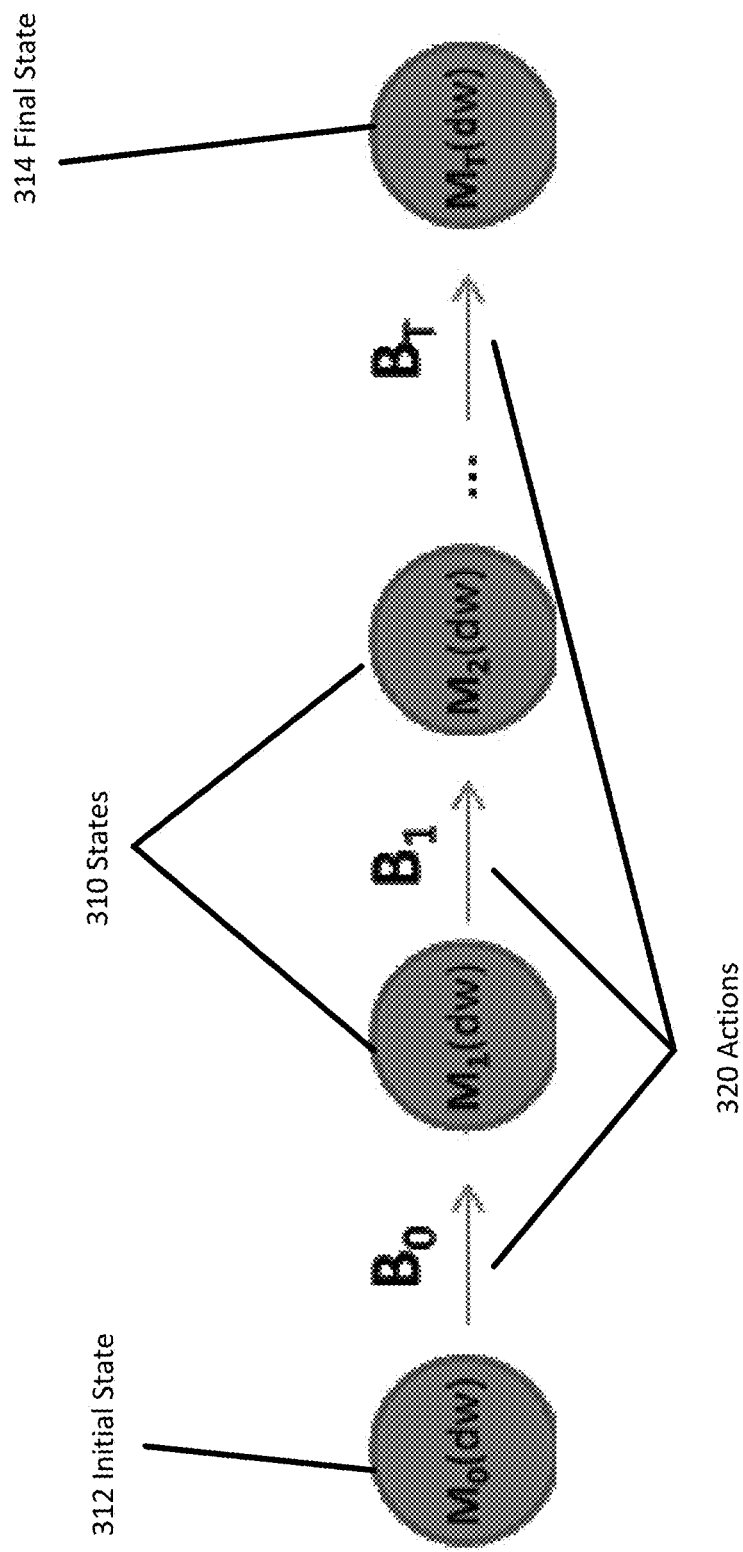
FIG. 2 depicts an example reinforcement machine-learnt classifier.

FIG. 2 depicts an example of a reinforcement learning strategy for selecting an RF pulse. FIG. 2 depicts the states (310, 312) of a reinforcement learning strategy $M_T(dw)$ at three different times (T) 0, 1, and 2. The final state 314 $M_T(dw)$ is also depicted. The goal of the reinforcement machine-learnt classifier is to identify the actions 320, e.g. the RF pulses $B_0, B_1, \ldots B_T$, that move the initial state 312 M0(dw) through the states 310 to the final state 314 $M_T(dw)$. At each state (310, 312) ($M_1(dw)$, $M_2(dw)$, $M_3(dw)$), the strategy identifies possible RF pulses 320 that result in a future state that is closer to the final state 314 $M_T(dw)$.

The reinforcement learning strategy may be used to select a second RF pulse (or a third RF pulse, or a fourth RF pulse, or a Fifth RF pulse . . . ). The reinforcement learning strategy identifies a policy for selecting actions (RF pulses or a change in a previous RF pulse) that minimizes the long-term reward, e.g. the difference between the selected magnetization and the effect of each RF pulse. Using the strategy, an optimized pulse sequence may be worked out. Beginning with an initial magnetization state Mi, the system learns a sequence of pulses (First RF pulse, Second RF pulse, Third RF pulse . . . Nth RF pulse) and a corresponding sequence of signals based on the end target of minimizing the difference. RF pulse sequences that perform worse (lower rewarded) may be discarded. For example, at each state, multiple different RF pulses may be simulated to identify a subsequent state (and further down the chain). Certain sequences may not improve the state (e.g. not lead to the final desired state). The sequences that are not promising may be discarded while the sequences that are highly rewarded may continue to add RF pulses until the sequences reach the final result. Each of the RF pulse sequences that end at the final desired result within certain parameters (e.g. time, number of pulses, resource constraints) may then be compared against one another to determine the sequence of RF pluses that is the most efficient (either in time, number of pulses, resources, etc.).

The RF pulses (and parameters) may be selected from a table of known RF pulses. The reinforcement learning strategy may use known RF pulses and results to influence the selection. The reinforcement learning strategy may use data from prior scans and prior used RF pulse sequences to identify long term results in the sequence. The training data may include examples of the actions taken to get to a positive and/or negative result. The reinforcement learning strategy may learn from the example to calculate a reward structure to guide the RF pulse selection towards the desired outcome.

The number of RF pulses selected may be limited by a maximum time for the RF sequence. For example, a RF pulse sequence may last no longer than 2 ms, 5 ms, or 10 ms among other times. The number of pulse sequences may range, for example, from 2 to hundreds or thousands of RF pulses. For a maximum time of 10 ms, with each pulse taking on average 0.02 ms, the maximum number of RF pulses may be set to 500. The maximum time may be set by an operator or as a function of a MRI system. In an embodiment, the reward structure of the reinforcement learning strategy may be set to reward shorter RF sequence times (e.g. either fewer states or a shorter overall RF pulse time). The reward structure may be configured to other efficiencies such as fewer RF pulses, less power usage, etc.

In an embodiment, a Monte Carlo method may be used in the reinforcement learnt strategy. The Monte Carlo method may include a policy that defines the states and the reward. Policy iteration for the method includes policy evaluation and policy improvement. Given an RF pulse distribution function for each state, the reward for each state/RF pulse pair is computed for all state-pulse pairs. A table representing the expected reward of applying a given pulse when in a given state is stored. The estimate of the reward for a given state-pulse pair may be computed by averaging the sampled returns that originated from that state-pulse pair over many Monte Carlo trials. The method may generate an estimate of the reward function for every state-pulse pair. Having generated the estimate of the reward function for every state-pulse pair, an optimal RF pulse (having the largest expected reward) is determined for each respective state, by summing the rewards for the state over all of its pulse values.

In an embodiment, the RF pulse distribution may be evaluated by a temporal difference method, a policy gradient method, simulated annealing, a cross-entropy search, or the like. Deep learning, or deep neural networks may be integrated with reinforcement learning, for example, as an approximator of the action or reward. An evolutionary computation method may be used. In evolutionary computation, methods derived from biological examples such as natural selection are used to identify solutions. For RF pulse design, the range of subsequent RF pulses in a pulse sequence may be narrowed.

The method repeats with the second RF pulse replacing the first RF pulse. The computing, determining, and selecting acts (A120, A130, A140) are repeated until the difference between the desired magnetization and computed magnetization is less than a predefined threshold. The second or new RF pulse is applied and the effect is determined. If the effect is within a threshold of the desired result, the process is stopped and the sequence of RF pulses is saved for use in a future MRI scan. If the effect is not within the threshold of the desired result, the process of computing, determining, and selecting is repeated again with a new RF pulse that is selected by the reinforcement learning strategy.

Training data for the reinforcement learnt strategy may be acquired from prior scans. MR parameters and results may be acquired and stored in a memory. The training data may include spatial maps of objects that are representative of the tissue relaxation parameters, proton density etc. The training data may include RF pulse sequences and state data for prior scans.

In an embodiment, the desired outcome results in a RF pulse sequence that maximizes an image contrast, that is, the differences between the signals from different tissue. In other embodiments, the reinforcement learning strategy formulates the sequence to achieve a desired level of contrast or clarity for an image in the minimum amount of time. For example, the reward structure of the reinforcement learnt strategy may be weighted to favor shorter RF pulse sequences.

At act A150 of FIG. 1, the sequence of RF pulses is stored for use in a subsequent MRI procedure. The sequence of RF pulses may be stored in a database along with a description of the desired result and object. An operator of a MRI device may access the database and retrieve the RF pulse sequence when scanning and similar object with a similar desired result.

In certain embodiments, feedback may be provided for the desired result. Feedback may include a quality score and/or may provide guidance for setting the predetermined threshold for the difference between a current state and the desired state. For example, a stored learnt RF pulse sequence may be used in a MRI scan. Feedback may be provided that indicates that the RF pulse sequence did not provide the desired result in an adequate manner. The feedback may result in adjustment to the reward structure for the reinforcement learnt strategy. The training data may also be updated at regular intervals with new models or new parameters. The reinforcement strategy may be updated regularly or with different sets of training data or different reward structures.

Figure 3:
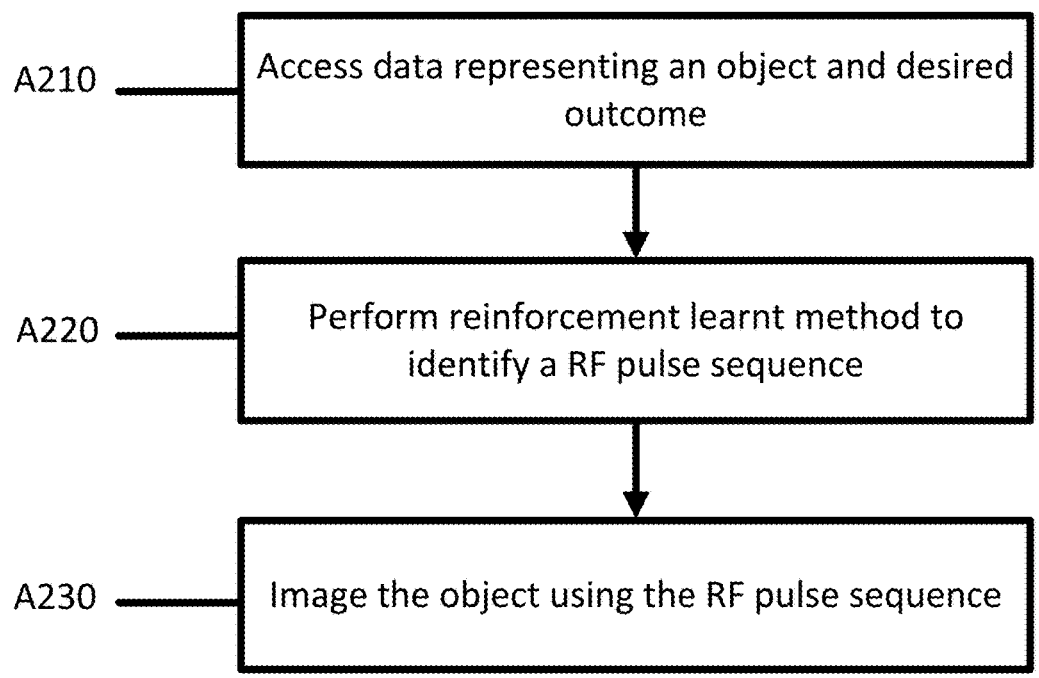
FIG. 3 depicts an example workflow for designing RF pulses using a reinforcement machine-learnt classifier.

FIG. 3 illustrates one embodiment of a method for designing RF pulses using deep learning. A machine learnt network is used to select subsequent RF pulses in a RF pulse sequence in order to generate a desired result. The acts are performed by the system of FIG. 4, other systems, a medical scanner, a workstation, a computer, and/or a server. For example, acts A210 and A220 are performed by a processing component, such as a workstation or a computer. Act A230 may be performed by a medical scanner. The acts are performed in the order shown (e.g., top to bottom) or other orders. Additional, different, or fewer acts may be used, such as storing the RF pulse sequence instead of imaging the object.

At act A210, the processor accesses data representing an object and a desired result. The object may be a model of an anatomy of a body. The model may be, for example, a three-dimensional model including values for different types of tissues in the model. The model may be representative of a specific patient or may be representative of, for example, an organ.

The desired result (e.g. final state) may be selected automatically or by an operator depending on a type of scan. The desired result may be selected to optimize one or more parameters of the MRI scan. Optimization may relate to the quality of the resulting MRI image or the process in which the image is obtained. Optimization, for example, may result in a more accurate or clearer image with improved contrast. Optimization may result in an MRI scan that uses fewer resources.

At act A220, the processor performs reinforcement learnt method to identify a RF pulse sequence that generates a result within a predefined value of the desired outcome. In a reinforcement learnt method, RF pulses are selected and simulated. For each state that results from an RF pulse, a reward is identified based on the relationship of the state and the final desired state. The reinforcement learning method identifies states (and actions) that provide the highest rewards, e.g. resulting in an efficient sequence from the initial state to the final desired state. Each action is an additional pulse that forms a sequence. The processor may identify one or more RF pulse sequences that claim higher rewards.

In the reinforcement learnt method, the agent may generate a finite number of states and in generating a state, a numerical reward is collected, where negative numbers may represent punishments. Each state has a changeable value attached to it. From every state, there are subsequent states that may be reached by actions (RF pulses). The value of a given state is defined by the averaged future reward that may be accumulated by selecting actions from the particular state. Actions are selected according to a policy that may also change. The goal of the reinforcement learnt method is to select actions that maximize the expected cumulative reward (the return) of the agent. Given the desired result, the reinforcement learnt method outputs a sequence of pulses to achieve the result based on a sequence of actions using the learnt agent.

At act A230, the processor sends a command to an MRI machine to image the object using the RF pulse sequence. The object may be a similar object to the object of act A220.

For example, the object may be a similar view of an organ or portion of a patient's body containing similar tissue types. The RF pulse sequence may be stored in a database until a scan is to be performed by the MRI machine. For example, the RF pulse sequence may be stored in a database with other RF pulse sequences for different objects or desired results. An operator of a MRI machine may select the RF pulse sequence from the database when performing a scan.

FIG. 4 shows one embodiment of a system for providing efficient RF pulses using a reinforcement learning strategy. The system includes an MRI system 540, a server 550, and a database 570. The server 550 contains a processor 530, a memory 520, and a Bloch simulator 510. Additional, different, or fewer components may be provided. For example, network connections or interfaces may be provided, such as for networking with a medical imaging network or data archival system. A workstation with a user interface may be provided for an operator to input data. The Bloch simulator 510 may be included in the processor 530.

The processor 530, memory 520, and Bloch simulator 510 are part of the server 550. Alternatively, the processor 530, memory 520, and/or Bloch simulator 520 are part of other devices, such as an archival and/or image processing system, such as associated with a medical records database workstation, computer, or server, separate from the server 550. In other embodiments, the processor 530, memory 520, and Bloch simulator 520 are a personal computer, such as desktop or laptop, a workstation, a server, a network, or combinations thereof. The processor 530, memory 520, and Bloch simulator 520 may be provided without other components for acquiring data by scanning a patient such as the MRI system 540.

The MRI system 540 and server 550 may be provided at a same location. The location may be a same room, same building, or same facility. The server 550 may be spaced apart by a network by being in a different facility or by being in a different city, county, state, or country. The server 550 and database 570 may be remote from the location of the MRI system 540.

The MRI system 540 is a medical diagnostic imaging system. The MRI system 540 includes a main field magnet, such as a cryo-magnet, and gradient coils. A whole-body coil is provided for transmitting and/or receiving. Local coils may be used, such as for receiving electromagnetic energy emitted by atoms in response to pulses. The MRI system 540 may receive RF pulse data from the server 550. The MRI system 540 may store the RF pulse data locally or request the RF pulse data from the server 550. Other processing components may be provided, such as for generating transmit pulses for the coils based on the sequence and for receiving and processing the received k-space data. The received k-space data is converted into object or image space data with Fourier processing.

The memory 520 may be a graphics processing memory, a video random access memory, a random-access memory, system memory, cache memory, hard drive, optical media, magnetic media, flash drive, buffer, database, combinations thereof, or other now known or later developed memory device for storing data or video information. The memory 520 is part of the server 550, part of a computer associated with the processor 530, part of a database, part of another system, a picture archival memory, or a standalone device.

The memory 520 stores medical imaging data representing the object, RF pulse data, learnt data for the machine learnt reinforcement strategy, graphical or display setting, and/or images. The memory 520 may store data during processing for applications and/or may store training data (e.g., models, effects, and RF pulse parameters).

The memory 84 or other memory is alternatively or additionally a non-transitory computer readable storage medium storing data representing instructions executable by the programmed processor 530 for designing RF pulses. The instructions for implementing the processes, methods and/or techniques discussed herein are provided on non-transitory computer-readable storage media or memories, such as a cache, buffer, RAM, removable media, hard drive, or other computer readable storage media. Non-transitory computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code, and the like, operating alone, or in combination. Likewise, processing strategies may include multiprocessing, multitasking, parallel processing, and the like.

In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU, or system.

The processor 530 is a general processor, central processing unit, control processor, graphics processor, digital signal processor, three-dimensional rendering processor, image processor, application specific integrated circuit, field programmable gate array, digital circuit, analog circuit, combinations thereof, or other now known or later developed device for designing RF pulses. The processor 530 is a single device or multiple devices operating in serial, parallel, or separately. The processor 530 may be a main processor of a computer, such as a laptop or desktop computer, or may be a processor for handling some tasks in a larger system, such as in the imaging system 530. The processor 530 is configured by instructions, design, hardware, and/or software to perform the acts discussed herein.

The Bloch simulator 510 may be a general processor, central processing unit, control processor, graphics processor, digital signal processor, three-dimensional rendering processor, image processor, application specific integrated circuit, field programmable gate array, digital circuit, analog circuit, combinations thereof, or other now known or later developed device for simulating RF pulses. For example, the Block simulator 510 is the processor 530 configured by instructions to simulate application of a pulse to an object. The Bloch simulator is configured to receive inputs from the processor 530 or memory 520, such as RF pulse parameters (and gradients) and the magnetization state and output parameters that describe a new state.

The processor 530, Bloch simulator 510, and/or server 550 are configured to perform the acts discussed above for designing a RF pulse. The processor 530, Bloch simulator 510, and/or server 550 are configured to select an RF pulse, simulate the results, and using a reinforcement learning strategy select a subsequent RF pulse. The processor 530, Bloch simulator 510, and/or server 550 are configured to select additional RF pulses until the result is within a predefined value of a desired result. The reinforcement learning strategy may be learnt using the magnetization Mi as the "state" and the effect of Bi is considered as the "action" to transit Mi from one state to another. The "reward" is the difference in the estimated final MT' and the desired MT. The goal is to minimize the difference.

The reinforcement learning strategy may be learnt using prior scan data or models of an object stored in the database 570 or memory 520. The processor 530 and memory 520 may store individual frames, series of frames, and attributes of the image frames for the imaging system 540. The server 550 and/or database 570 may store object models, image frames, series of images frames, and MRI parameters from the MRI system 540. The models may include parameters for each type of tissue present.

The server 550 connects to the imaging system 540 via a network. The network is a local area, wide area, enterprise, another network, or combinations thereof. In one embodiment, the network is, at least in part, the Internet. Using TCP/IP communications, the network provides for communication between the processor 530 and the server 550. Any format for communications may be used. In other embodiments, dedicated or direct communication is used.

The server 550 is a processor or group of processors. More than one server 550 may be provided. The server 550 is configured by hardware and/or software. In one embodiment, the server 550 performs machine learning of the reinforcement strategy with training data in the database 570. The server 550 may acquire and the database 570 may store data from multiple scanning machines.

The database 570 is a memory, such as a bank of memories, for storing training data, such as images and respective parameters. Weights or values of parameters of the models and/or reinforcement learning strategy are stored in the database 570 and/or the memory 520. The database 570 may further store RF pulse sequences that relate to objects and desired results. The MRI system 540 may access the database 570 to acquire RF pulse sequences for scans that relate to similar objects and desired results.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A method for designing a RF pulse sequence, the method comprising:
    identifying, by a processor, a selected magnetization for an object;
    computing, by the processor, an effect of a first RF pulse to the object, wherein the effect comprises a computed magnetization;
    determining, by the processor, a difference between the selected magnetization and computed magnetization;
    selecting, by the processor, by a reinforcement machine-learnt classifier, a second RF pulse;
    repeating, by the processor, with the second RF pulse replacing the first RF pulse, computing, determining, and selecting until the difference between the selected magnetization and computed magnetization is less than a predefined threshold; and
    storing, by the processor, the RF pulse sequence comprising at least the first RF pulse and second RF pulse for use in a subsequent MRI scan by an MRI scanner.

2. The method of claim 1, wherein for the reinforcement machine-learnt classifier uses a Markov Decision Process in which an initial magnetization is a first state; the effect is the second state; the first RF pulse is an action that transits the first state to a second state; the reward is the difference in the selected magnetization and computed magnetization; and a goal of the reinforcement learnt strategy is to minimize the difference.

3. The method of claim 1, wherein the reinforcement machine-learnt classifier is trained by performing computing, determining, and selecting multiple times with a variety of objects and select magnetizations, and updating the reinforcement machine-learnt classifier to maximize a total cumulated reward.

4. The method of claim 1, wherein each time the repeating act is executed, a respectively different discount factor is applied to the difference before determining whether the difference between the selected magnetization and computed magnetization is less than a predefined threshold difference.

5. The method of claim 1, wherein the computed magnetization is a distribution of the magnetization over an off-resonance.

6. The method of claim 5, wherein the difference between the selected magnetization and computed magnetization is determined using a L1-norm.

7. The method of claim 5, wherein the difference between the selected magnetization and computed magnetization is determined using a L2-norm.

8. The method of claim 1, wherein computing an effect of a first RF pulse comprises simulating the effect of the first RF pulse on a three-dimensional model of the object.

9. The method of claim 8, wherein the three-dimensional model comprises at least two different types of tissues.

10. The method of claim 1, wherein the effect is computed with a Bloch simulator.

11. A method for automatically generating a RF pulse sequence, the method comprising:
    accessing, by a processor, data representing an object and a selected outcome;
    performing, by the processor, a reinforcement learnt method to identify the RF pulse sequence that generates a result within a predefined value of the selected outcome; and
    imaging, by a MRI scanner, the object using the RF pulse sequence.

12. The method of claim 11, wherein the data representing the object comprises a three-dimensional model of the object.

13. The method of claim 12, wherein the three-dimensional model comprises at least two different types of tissues.

14. The method of claim 13, wherein the reinforcement learnt method comprises:
    an initial magnetization as a first state; a first RF pulse as an action that moves the first state to a second state; an effect of a first RF pulse as the second state; and a reward for the first RF pulse/first state combination based on the difference in the selected outcome and effect.

15. The method of claim 11, wherein the selected outcome is a selected distribution of a magnetization over an off-resonance.

16. The method of claim 11, wherein the RF pulse sequence comprises more than ten RF pulses but less than 500.

17. A system for generating an efficient MRI scan, the system comprising:

a memory configured to store a representation of an object;

a Bloch simulator configured to simulate the effect of a RF pulse on the representation of the object; and a processor configured to identify a sequence of RF pulses using a reinforcement machine-learnt classifier and the simulations of the Bloch simulator.

18. The system of claim 17, further comprising:

a MRI system configured to scan the object using the sequence of RF pulses.

19. The system of claim 17, wherein the representation includes at least two different types of tissues.

20. The system of claim 17, wherein the reinforcement machine-learnt classifier is taught to reward states that lead to a selected magnetization as a result of one or more RF pulses.

* * * * *